(12) United States Patent
Varaprasad et al.

(10) Patent No.: US 10,727,044 B2
(45) Date of Patent: Jul. 28, 2020

(54) FILL MATERIAL TO MITIGATE PATTERN COLLAPSE

(71) Applicant: Honeywell International Inc., Morris Plains, NJ (US)

(72) Inventors: Desaraju Varaprasad, Dublin, CA (US); Songyuan Xie, E. Palo Alto, CA (US); Joseph T. Kennedy, San Jose, CA (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/126,019

(22) Filed: Sep. 10, 2018

(65) Prior Publication Data

US 2019/0088470 A1 Mar. 21, 2019

Related U.S. Application Data

(60) Provisional application No. 62/561,473, filed on Sep. 21, 2017, provisional application No. 62/615,180, filed on Jan. 9, 2018.

(51) Int. Cl.
*H01L 21/02* (2006.01)
*H01L 21/311* (2006.01)

(52) U.S. Cl.
CPC .. *H01L 21/02071* (2013.01); *H01L 21/02057* (2013.01); *H01L 21/02118* (2013.01);
(Continued)

(58) Field of Classification Search
None
See application file for complete search history.

(56) References Cited

U.S. PATENT DOCUMENTS

| 4,891,334 A | 1/1990 | Satoh et al. |
| 6,066,889 A | 5/2000 | Jones et al. |

(Continued)

FOREIGN PATENT DOCUMENTS

| JP | 3815555 B2 | 1/2004 |
| JP | 2006319063 A | 11/2006 |

(Continued)

OTHER PUBLICATIONS

International Search Report and Written Opinion issued in PCT/US2018/050482, dated Jan. 29, 2019, 9 pages.

(Continued)

*Primary Examiner* — Stephanie P Duclair
(74) *Attorney, Agent, or Firm* — Faegre Drinker Biddle & Reath LLP (57) ABSTRACT

A method for preventing the collapse of patterned, high aspect ratio features formed in semiconductor substrates upon removal of an initial fluid of the type used to clean etch residues from the spaces between the features. In the present method, the spaces are at least partially filled with a displacement solution, such as via spin coating, to substantially displace the initial fluid. The displacement solution includes at least one solvent and at least one, or combination of, a first fill material in the form of a phenol-formaldehyde polymer and/or a second fill material in the form of a polyalkene carbonate (PAC). The solvent is then volatized to deposit the fill materials in substantially solid form within the spaces. The fill materials may be removed by known plasma etch process via a high etch rate as compared to use of current fill materials, which prevents or mitigates silicon loss.

17 Claims, 4 Drawing Sheets

(52) U.S. Cl.
CPC .. *H01L 21/02282* (2013.01); *H01L 21/02356* (2013.01); *H01L 21/31138* (2013.01)

(56) References Cited

U.S. PATENT DOCUMENTS

| | | | |
|---|---|---|---|
| 6,114,044 | A | 9/2000 | Houston et al. |
| 6,188,301 | B1 | 2/2001 | Kornrumpf et al. |
| 6,358,673 | B1 | 3/2002 | Namatsu |
| 6,376,155 | B2 | 4/2002 | Ito |
| 6,656,666 | B2 | 12/2003 | Simons et al. |
| 6,753,037 | B2 | 6/2004 | Miller et al. |
| 6,833,320 | B2 | 12/2004 | Meagley et al. |
| 6,936,183 | B2 | 8/2005 | Chinn et al. |
| 7,119,025 | B2 | 10/2006 | Daley et al. |
| 7,338,614 | B2 | 3/2008 | Martin et al. |
| 7,358,008 | B2 | 4/2008 | Nanno et al. |
| 7,371,509 | B2 | 5/2008 | Hishiro |
| 7,402,488 | B2 | 7/2008 | Cho et al. |
| 7,438,990 | B2 | 10/2008 | Nanno et al. |
| 7,473,598 | B2 | 1/2009 | Liao et al. |
| 7,514,174 | B2 | 4/2009 | Nanno et al. |
| 7,687,406 | B2 | 3/2010 | Daley et al. |
| 7,749,909 | B2 | 7/2010 | Tomita et al. |
| 7,763,549 | B2 | 7/2010 | Tagawa |
| 7,846,623 | B2 | 12/2010 | Hishiro |
| 8,058,219 | B2 | 11/2011 | Rath et al. |
| 8,367,594 | B2 | 2/2013 | Mikhaylichenko |
| 8,541,301 | B2 | 9/2013 | Dubois et al. |
| 8,552,538 | B2 | 10/2013 | Daley et al. |
| 8,617,993 | B2 | 12/2013 | Yasseri et al. |
| 8,795,952 | B2 | 8/2014 | Somervell et al. |
| 8,956,981 | B2 | 2/2015 | Daley et al. |
| 9,111,950 | B2 | 8/2015 | Sun et al. |
| 9,454,081 | B2 | 9/2016 | Somervell et al. |
| 9,502,287 | B2 | 11/2016 | Ting et al. |
| 9,524,863 | B2 | 12/2016 | Ogihara et al. |
| 2004/0038155 | A1 | 2/2004 | Simons et al. |
| 2004/0132855 | A1* | 7/2004 | Kohl ............... B81C 1/00103 522/150 |
| 2004/0139987 | A1 | 7/2004 | Mount |
| 2004/0204328 | A1* | 10/2004 | Zhang ................ G03F 7/0048 510/175 |
| 2005/0142481 | A1 | 6/2005 | Jung et al. |
| 2007/0009839 | A1 | 1/2007 | Harumoto |
| 2007/0295365 | A1 | 12/2007 | Miya et al. |
| 2009/0032962 | A1 | 2/2009 | Hougham et al. |
| 2009/0229637 | A1 | 9/2009 | Yun et al. |
| 2010/0015744 | A1 | 1/2010 | Kazinzci |
| 2010/0063183 | A1* | 3/2010 | Sun ....................... B82Y 30/00 523/400 |
| 2010/0122711 | A1 | 5/2010 | Ryan |
| 2011/0042622 | A1 | 2/2011 | Hishiro |
| 2011/0143545 | A1 | 6/2011 | Okuchi et al. |
| 2011/0189858 | A1 | 8/2011 | Yasseri |
| 2013/0280123 | A1 | 10/2013 | Chen et al. |
| 2014/0017844 | A1 | 1/2014 | Anderson et al. |
| 2014/0373384 | A1* | 12/2014 | Sirard ............... H01L 21/02057 34/357 |
| 2015/0118821 | A1 | 4/2015 | Millward et al. |
| 2015/0221500 | A1 | 8/2015 | Ogihara et al. |
| 2016/0033863 | A1 | 2/2016 | Chen et al. |
| 2019/0088464 | A1 | 3/2019 | Varaprasad et al. |

FOREIGN PATENT DOCUMENTS

| | | |
|---|---|---|
| JP | 2013140881 A | 7/2013 |
| KR | 20080046838 A | 5/2008 |
| KR | 100928111 B1 | 6/2009 |
| KR | 20150105589 A | 9/2015 |
| WO | 2013030576 A1 | 3/2013 |

OTHER PUBLICATIONS

International Search REport and Written Opinion issued in PCT/US2018/050494, dated Mar. 22, 2019, 12 pages.

Jozef Brcka, "AXIC Appliction Report No. 10-Photoresist Stripping", Axic, Inc., Santa Clara, CA (1996), 5 pages.

Keun-Sun Kim et al., "Method of IPA Cleaning Process on Temperature and Spin Speed for Prevent Pattern Collapse in DRAM Capacitor", Proceedings of the World Congress on Engineerng and Computer Science 2012, vol. II, WCECS 2012, Oct. 24-26, 2012, San Francisco, USA, 3 pages.

O. Raccurt et al., "Influence of liquid surface tension on stiction of SOI MEMS", Institute of Physics Publishing, J. Micromech. Microeng. 14 (2004) pp. 1083-1090.

* cited by examiner (Prior Art)
FIG. 1

FILL MATERIAL TO MITIGATE PATTERN COLLAPSE

CROSS REFERENCE TO RELATED APPLICATIONS

This application claims the benefit under Title 35, U.S.C. § 119(e) of U.S. Provisional Patent Application Ser. No. 62/561,473, filed Sep. 21, 2017, entitled IMPROVED FILL MATERIAL TO MITIGATE PATTERN COLLAPSE, and U.S. Provisional Patent Application Ser. No. 62/615,180, filed Jan. 9, 2018, entitled IMPROVED FILL MATERIAL TO MITIGATE PATTERN COLLAPSE, the disclosures of which are incorporated by reference herein in their entirety.

BACKGROUND

1. Field of the Disclosure

The present disclosure relates to the manufacture of electronic components via photolithography techniques, and the mitigation or prevention of collapse, or stiction, which may occur between patterned, high aspect ratio features of semiconductor substrates upon removal of aqueous wash solutions of the type used to remove etch residue.

2. Description of the Related Art

During manufacture of electronic components, such as memory cells and other components built on a semiconductor substrate, such as a pure or doped silicon wafer, the substrate is processed using photolithography techniques. For example, a photoresist may be deposited onto a flat silicon wafer, followed by patterning the photoresist using UV exposure, for example. Then, the photoresist is developed to facilitate to remove of portions of the photoresist corresponding to the locations of trenches formed between narrow or high aspect ratio features formed on the substrate.

Next, an etching process, such as a plasma etch, is used to etch the trenches into the silicon wafer between the remaining photoresist portions, followed by removing the remaining photoresist and any remaining etchant or other debris using a wash solution which is typically an aqueous solution. In this manner, after the wash step, a series of elongated, vertically-disposed high aspect ratio silicon features are present which extend from the underlying silicon wafer, with the wash solution disposed within the trenches or spaces between the silicon features.

Figure 1:
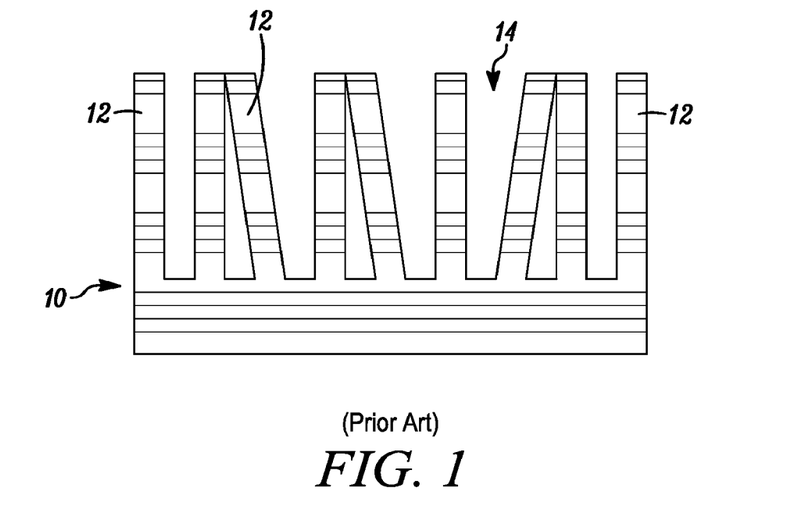
FIG. 1 is a sectional view of a semiconductor substrate which has been patterned to form high aspect ratio features, showing collapse of the features upon water removal according to prior processes.

Problematically, as shown in FIG. 1, direct evaporation of the wash solution at this stage tends to cause the patterned, high aspect ratio features to collapse on one another due to effects of the surface tension and capillary forces of the water of the wash solution. Collapse of high aspect ratio features concurrent with wash solution removal is a common failure mode in high resolution photolithography, particularly in less than 0.1 micron photolithography techniques, and is sometimes referred to as "stiction". In order to mitigate collapse of patterns during wafer drying, rinsing with isopropyl alcohol (IPA) and/or surface modification treatments may be employed. While these methods are successful in some pattern designs, in more recent, advanced designs of high aspect ratio nanostructures preventing collapse of structures continues to be a challenge.

In other methods of overcoming stiction-induced collapse of high aspect ratio features, a displacement solution of polymer fill may be introduced into the spaces between the high aspect ratio features to substantially displace the wash solution. Then, volatile components of the displacement solution are removed with heat treatment, with the polymer remaining within the spaces in substantially solid form to support the high aspect ratio features. The polymer is then removed using removal processes such as plasma ashing, with oxygen or hydrogen based plasma in conjunction with nitrogen or helium, for example.

However, polymer fill materials and plasma-based processes may potentially lead to the loss of silicon due to oxidation or nitridation of the high aspect ratio features, and many advanced memory designs are not able to tolerate such loss of silicon due to chemical conversion during the removal of polymer fills using plasma ashing process. Other advanced memory designs, such as transistor-less 3D-XPoint memory technology, cannot tolerate current plasma ashing processes for removal of current polymer fills used for stiction control.

SUMMARY

The present disclosure provides a method for preventing the collapse of patterned, high aspect ratio features formed in semiconductor substrates upon removal of an initial fluid of the type used to clean etch residues from the spaces between the features. In the present method, the spaces are at least partially filled with a displacement solution, such as via spin coating, to substantially displace the initial fluid. The displacement solution includes at least one solvent and at least one, or a combination of, a first fill material in the form of a phenol-formaldehyde polymer and/or a second fill material in the form of a polyalkene carbonate (PAC). The solvent is then volatized to deposit the fill material in substantially solid form within the spaces. The fill material may be removed by known plasma etch process via a high etch rate as compared to use of current fill materials, which prevents or mitigates silicon loss.

In one form thereof, the present disclosure provides a method for preventing collapse of semiconductor substrate features, including the steps of: providing a patterned semiconductor substrate having a plurality of high aspect ratio features with spaces between the features, the gap spaces at least partially filled with an initial fluid; displacing the initial fluid with a displacement solution including at least one solvent and at least one fill material in the form of at least one phenol-formaldehyde polymer selected from the group consisting of a novolac polymer and a resol polymer; exposing the substrate to a first elevated temperature to substantially remove the solvent from the spaces and deposit the fill material in substantially solid form within the spaces; and exposing the substrate to a dry etch process to remove the fill material from the gap spaces.

The at least one phenol-formaldehyde polymer may include a novolac polymer comprises at least one novolac polymer of the following formula:

(I)

wherein each R is independently a hydrogen or a hydrocarbon group containing up to 20 carbons, n ranges between 2 and 200, any of the R groups may be bonded to any of the aromatic carbon atoms, i.e. $C_2$ to $C_6$, the $CH_2$ (methylene) groups may be bonded either to any of the aromatic carbon atoms, to $C_2$ to $C_6$, or to any aromatic ring and the average ratio of methylene groups to aromatic rings in the polymer may vary from between about 0.5 to about 1.5.

The first temperature may be between 100° C. and 175° C. The at least one solvent may include a solvent having a boiling point between 50° C. and 250° C. The displacement step may be carried out via spin coating.

The initial fluid may be an aqueous wash solution or the initial fluid may include a non-aqueous flushing solution.

In another form thereof, the present invention provides a method for preventing collapse of semiconductor substrate features, including the steps of: providing a patterned semiconductor substrate having a plurality of high aspect ratio features with spaces between the features, the gap spaces at least partially filled with an initial fluid; displacing the initial fluid with a displacement solution including at least one solvent, at least one first fill material in the form of a phenol-formaldehyde polymer, and at least one second fill material in the form of a polyalkene carbonate (PAC); exposing the substrate to a first elevated temperature to substantially remove the solvent from the spaces and deposit the first and second fill materials in substantially solid form within the spaces; and exposing the substrate to a dry etch process to remove the first and second fill materials from the gap spaces.

The at least one second fill material may include at least one polyalkene carbonate (PAC) selected from the group consisting of polypropylene carbonate, polybutylene carbonate, poly(cyclohexane) carbonate, poly(norbornene) carbonate, and combinations thereof.

The at least one first fill material may include at least one novolac polymer of the following formula:

(I)

wherein each R is independently a hydrogen or a hydrocarbon group containing up to 20 carbons, n ranges between 2 and 200, any of the R groups may be bonded to any of the aromatic carbon atoms, i.e. $C_2$ to $C_6$, the $CH_2$ (methylene) groups may be bonded either to any of the aromatic carbon atoms, to $C_2$ to $C_6$, or to any aromatic ring and the average ratio of methylene groups to aromatic rings in the polymer may vary from between about 0.5 to about 1.5.

The first temperature may be between 100° C. and 175° C. The at least one solvent may include a solvent having a boiling point between 50° C. and 250° C. The displacement step may be carried out via spin coating.

The first and second fill materials may be substantially insoluble in water. The displacement solution may include between 5 wt. % and 30 wt. % of the first and second fill materials, based on the total weight of the displacement solution. The displacement solution may further include between 5 wt. % and 50 wt. % of the at least one first fill material and between 50 wt. % and 95 wt. % of the at least one second fill material, based on the combined weight of the first and second fill materials.

The exposing steps may be conducted in one of an ambient air atmosphere and an atmosphere of an inert gas.

In a further form thereof, the present invention provides a method for preventing collapse of semiconductor substrate features, including the steps of: providing a patterned semiconductor substrate having a plurality of high aspect ratio features with spaces between the features, the gap spaces at least partially filled with an initial fluid; displacing the initial fluid with a displacement solution including at least one solvent and at least one fill material in the form of a polyalkene carbonate (PAC); exposing the substrate to a first elevated temperature to substantially remove the solvent from the spaces and deposit the fill material in substantially solid form within the spaces; and exposing the substrate to a dry etch process to remove the fill material from the gap spaces.

The fill material may include at least one polyalkene carbonate (PAC) selected from the group consisting of polypropylene carbonate, polybutylene carbonate, poly(cyclohexane) carbonate, poly(norbornene) carbonate, and combinations thereof. The first temperature may be between 100° C. and 175° C.

BRIEF DESCRIPTION OF THE DRAWINGS

The above mentioned and other features of the disclosure, and the manner of attaining them, will become more apparent and the disclosure itself will be better understood by reference to the following description of embodiments of the disclosure taken in conjunction with the accompanying drawings.

Corresponding reference characters indicate corresponding parts throughout the several views. The exemplifications set out herein are provided to illustrate certain exemplary embodiments and such exemplifications are not to be construed as limiting the scope in any manner.

DETAILED DESCRIPTION

Figure 2:
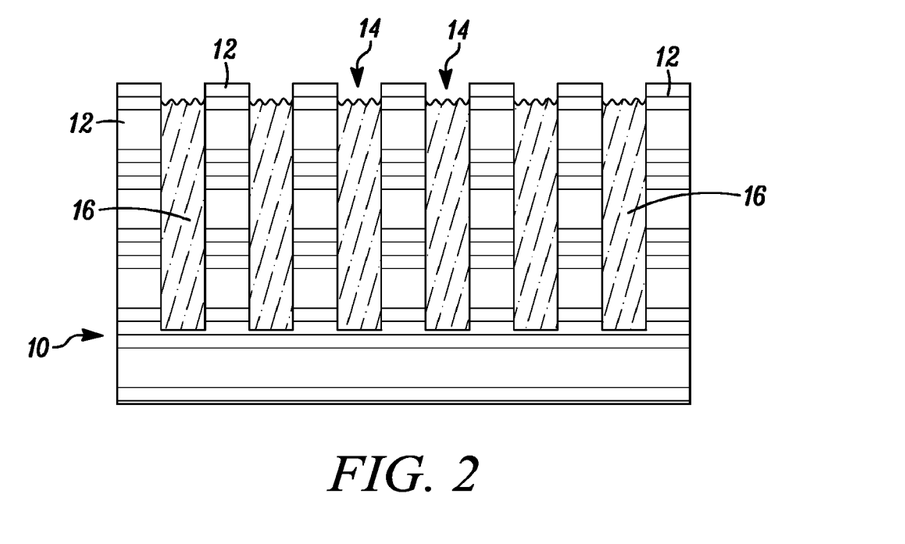
FIG. 2 is a view of a semiconductor substrate with high aspect ratio features after photolithographic pattering, additionally showing an initial fluid disposed within the spaces between the features after etch residues are removed.

Referring to FIG. 2, a semiconductor substrate 10, such as a pure or doped silicon wafer, is shown, which has been patterned using photolithography techniques to form a number of high aspect ratio features 12, such as pillars or columns, having spaces 14, such as lines or trenches, therebetween. Features 12 may have an aspect ratio of height to width greater than 4:1, or even 10:1 or greater, for example. In FIG. 2, substrate 10 is shown at a stage in which an initial fluid 16 of the type used to clean photolithographic etch residues, is disposed within spaces 14 between the high aspect ratio features 12. As described further below, the initial fluid 16 is displaced by a displacement solution according to the present disclosure.

The fill materials disclosed herein may be either polymers or oligomers of varying molecular weight and, for the purposes of the present disclose, the term "polymer" generally encompasses molecules having a plurality of repeat units, including both polymers and oligomers.

The present displacement solution may include at least one first fill material in the form of at least one phenol-formaldehyde polymer, which may be a novolac polymer, such as a phenolic novolac polymer as described below. Suitable novolac polymers include Accuflo® T-25 or T-27 Series polymers, available from Honeywell International Inc., and described in U.S. Pat. No. 5,858,547, the entire disclosure of which is expressly incorporated herein by reference.

Suitable novolac polymers are commercially available or may be derived via reacting phenols or derivatives therefrom, such as ortho-, meta-, and para-cresol, with formaldehyde, typically, an acid catalyzed reaction of a molar excess of phenol with formaldehyde. The generalized structure of such novolacs is represented below in formula I:

wherein each R independently is a hydrogen or a hydrocarbon group containing up to 20 carbons and n ranges between 2 and 200. Any of the R groups may be bonded to any of the aromatic carbon atoms, i.e. $C_2$ to $C_6$. Similarly, the $CH_2$ (methylene) groups may be bonded either to any of the aromatic carbon atoms, to $C_2$ to $C_6$, or to any aromatic ring. The average ratio of methylene groups to aromatic rings in the polymer may vary from between about 0.5 to about 1.5. Optionally, the novolac polymer may also contain crosslinking groups such as those derived from hexamethylenetriamine. Suitable novolac polymers include low molecular weight novolacs having a molecular weight ranging between about 200 and about 20,000, preferably, between about 200 to about 2000, and more preferably between about 200 to about 1200 amu. Such preferred novolac polymers include phenolic novolacs derived from phenol and having aromatic rings bonded to hydrogen atoms, methylene groups and a hydroxyl group. Also preferred are the cresylic novolac polymers derived from ortho-, meta-, or para-cresol having aromatic rings bonded to one methylene group in a position either ortho, meta, or para to the hydroxyl groups and aromatic rings bonded to methylene groups and a hydroxyl group. Copolymer cresylic novolacs derived from varying combinations of ortho-, meta- and para-cresol and copolymers and blends derived from varying combinations of phenol and ortho-, para-, and meta-cresol may also be preferred.

Alternatively, the phenol-formaldehyde polymer may be in the form of at least one resol polymer of the type which is formed by the catalyzed, typically base catalyzed, reaction of phenol with a molar excess of formaldehyde.

In this manner, the term "phenol formaldehyde" polymer, as used herein, encompasses both novolac polymers and resol polymers.

The present displacement solution may include at least one second fill material selected from the group consisting of polyalkene carbonates (PACs).

Specific examples of polyalkene carbonates include polyethylene carbonate, polypropylene carbonate, polybutylene carbonate, poly(cyclohexane) carbonate, and poly(norbornene) carbonate.

Additionally, for the second fill material, more than one of the foregoing polyalkene carbonates may be used in combination.

In this manner, the first and second fill materials are separate and chemically distinct from one another and, as discussed below, may be provided as a simple mixture in a solvent carrier including one or more solvents.

The present displacement solution may include only the first fill material, only the second fill material, or a combination or blend of one or more first fill materials together with one or more second fill materials. If the present displacement solution includes only the first fill material, the first fill material may be in the form of one or more phenol formaldehyde polymers. If the present displacement solution includes only the second fill material, the second fill material may be in the form of one or more polyalkene carbonates. If the present displacement solution includes a combination or blend of the first and second fill materials, the first and second fill materials may each be in the form of one or more phenol formaldehyde polymers and one or more polyalkene carbonates, respectively.

Typically, the total amount of the fill materials in the displacement solution, whether the displacement solution includes only the first fill material, only the second fill material, or a combination or blend of the first and second fill materials, based on the overall weight of the displacement solution, may be as low as 5 wt. %, 10 wt. %, or 15 wt. %, or as high as 20 wt. %, 25 wt. %, or 30 wt. %, or may be within any range defined between any pair of the foregoing values, such as between 5 wt. % and 30 wt. %, between 10 wt. % and 25 wt. %, or between 15 wt. % and 20 wt. %, for example, with the remainder being one or more solvents of the type discussed below and/or other additives such as those discussed below.

In displacement solutions including a combination or blend of first and second fill materials, based on the combined weight of the first and second fill materials in the displacement solution (not including solvents or other components), the first fill material may typically be present in an amount as little as 5 wt. %, 15 wt. %, or 20 wt. %, or as great as 30 wt. %, 40 wt. %, or 50 wt. %, or within any range between any two of the foregoing values, such as 5 wt. % to 50 wt. %, 15 wt. % to 40 wt. %, or 20 wt. % to 30 wt. %, for example, and the second fill material may typically be present in an amount as little as 50 wt. %, 60 wt. %, or 70 wt. %, or as great as 80 wt. %, 85 wt. %, or 95 wt. %, or within any range between any two of the foregoing values, such as 50 wt. % to 95 wt. %, 60 wt. % to 85 wt. %, or 70 wt. % to 80 wt. %, for example.

The first and second fill materials are generally insoluble in water, though are readily soluble in organic solvents such as polyglycol methyl ether acetate (PGMEA), ethyl lactate, n-methyl pyrrolidone (NMP), acetone, anisole, n-butyl acetate, and ethyl acetate Di(ethylene glycol) ethyl ether acetate (DE Acetate)(Carbitol Acetate), Ethylene Glycol Diacetate, Dowanol Eph, Dowanol PPH Glycol Ether (Propylene glycol phenyl ether), Dowanol PGDA (Propylene glycol diacetate), Methyl Ethyl Ketone (MEK), Gamma Butyrolactone (GBL), N,N-Dimethylformamide (DMF), Propylene Carbonate, Tetrahydrofuran (THF), Caprolactone, Ethyl lactate, 50:50 Ethyl Acetate/Toluene, 50:50 MEK/Toluene. Therefore, the displacement solution includes a primary solvent which solvates the fill material. The primary solvent should also be compatible with water to enable the displacement solution to effectively displace the aqueous wash solution in the manner described below.

Optionally, in order to prevent potential coagulation of the fill material during the displacement process described below, the displacement solution may also include a secondary solvent that is at least partially miscible with water and also at least partially solvates the fill material. Examples of such secondary solvents include acetone, MEK, ethyl lactate, n-methyl pyrrolidone (NMP), and dimethylformamide (DMF).

Typically, the secondary solvent may be present, based on the total weight of the solvents in the displacement solution, in a broadly variable amount between 1 wt. % and 99 wt. %, or between 5 wt. % and 50 wt. %, for example. The primary and secondary solvents may have boiling points as low as 50° C. or as high as 250° C., for example.

Other components of the displacement solution may include surfactants, such as non-fluorinated hydrocarbons, fluorinated hydrocarbons, or combinations thereof, typically present in an amount of 2.0 wt. % or less.

The components of the displacement solution may be blended together with simple mixing, for example. When mixed, the displacement solution may have a viscosity as little as 1.0 cP, 2.0 cP, or 3.0 cP, or as high as 10.o cP, 20.0 cP, or 30.o cP, or within any range defined between any pair of the foregoing values, such as between 1.0 cP and 30.0 cP, between 2.0 cP and 20.0 cP, or between 3.0 cP and 10.0 cP, for example, as determined by a Brookfield spindle-type viscometer, such as a Brookfield LVDV-II-PCP or DV-II+ spindle-type viscometer.

Referring to FIGS. 2-5 below, a method of using the present displacement solution is described. In FIG. 2, substrate 10 is shown at a stage following completion of one or more photolithography processes, in which an initial fluid 16 is disposed within the spaces 14 between the high aspect ratio features 12. In one embodiment, the initial fluid 16 may be an aqueous wash solution of the type used to remove photolithographic etch residues. Typically, the aqueous wash solution will be primarily an aqueous solution including dissolved or particulate etch residues, and may either partially or completely fill the spaces between the high aspect ratio features.

In an optional first step, the initial fluid 16 is a flushing solvent or flushing solution, which is non-aqueous and is a mutual solvent for both water and the fill materials disclosed herein. The flushing solution may include isopropyl alcohol (IPA), acetone, or ethyl lactate, for example, and may be used to displace the aqueous wash solution prior to displacement of the flushing solution using the displacement solution of the present disclosure.

Figure 3:
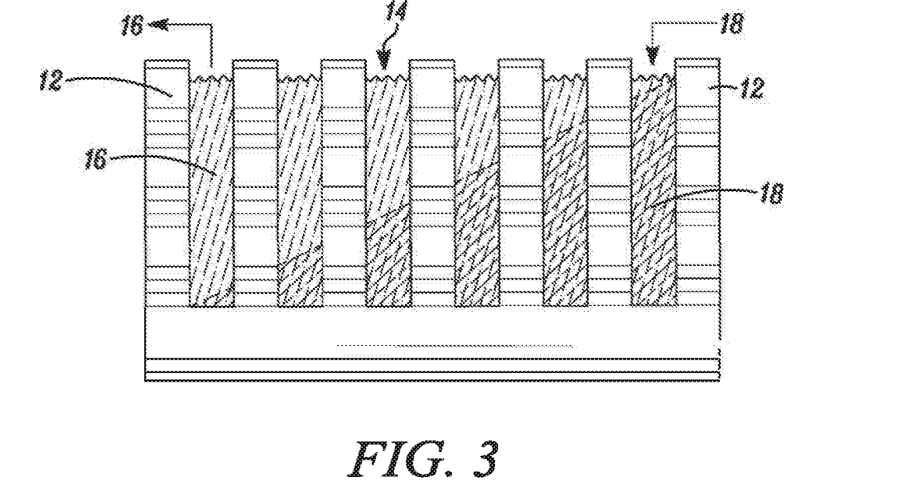
FIG. 3 schematically shows the displacement of the initial fluid from the spaces between the high aspect ratio features using a displacement solution in accordance with present disclosure.

Referring to FIG. 3, the displacement solution 18 in accordance with the present disclosure is applied to substrate 10 to volumetrically displace the initial fluid 16 which, as described above, may be in the form of an aqueous wash solution or the initial flushing solution. The displacement solution 18 may be applied to substrate 10 via spin coating, in which the volume of displacement solution applied is sufficient to completely, or substantially completely, volumetrically displace and remove the initial fluid 16, as schematically shown by the dashed diagonal line in the arrows in FIG. 3, in which the displacement solution is spin-coated into spaces 14 between features 12 and displaces the initial fluid 16.

In this manner, with continued reference to FIG. 3, the spaces 14 between high aspect ratio features 12 are either completely filled, or substantially filled, with the displacement solution 16. Because the primary solvent of the displacement solution is incompatible with water, the primary solvent is not miscible with water and is therefore able to displace the aqueous wash solution. Concurrently, if a secondary solvent is used in the displacement solution, same is partially miscible with water to prevent coagulation of the fill materials upon contact of the displacement solution with the aqueous wash solution.

Next, the substrate 10 is exposed to a first heat treatment step at a first elevated temperature which may be as low as 100° C., 115° C., or 130° C., or as high as 145° C., 160° C., or 175° C., or may be within any range defined between any two of the foregoing values, such as 110° C. to 175° C., 115° C. to 160° C. or 130° C. to 145° C., for example. The first elevated temperature is above the boiling point of water and the solvents in the displacement solution and yet below the decomposition temperature of the fill materials of the displacement solution. In this manner, when the substrate is exposed to the first elevated temperature, the volatile components of the displacement solution, such as the primary solvent and secondary solvent, as well as any residual water or residual solvents from the aqueous wash solution which may be present, are removed to deposit the fill materials in substantially solid form within the spaces 14 between the high aspect ratio features 12. The first heat treatment step may be carried out in an ambient air atmosphere or, alternatively, may be carried out in a vacuum or in an inert atmosphere under nitrogen or other inert gas, for example.

Figure 4:
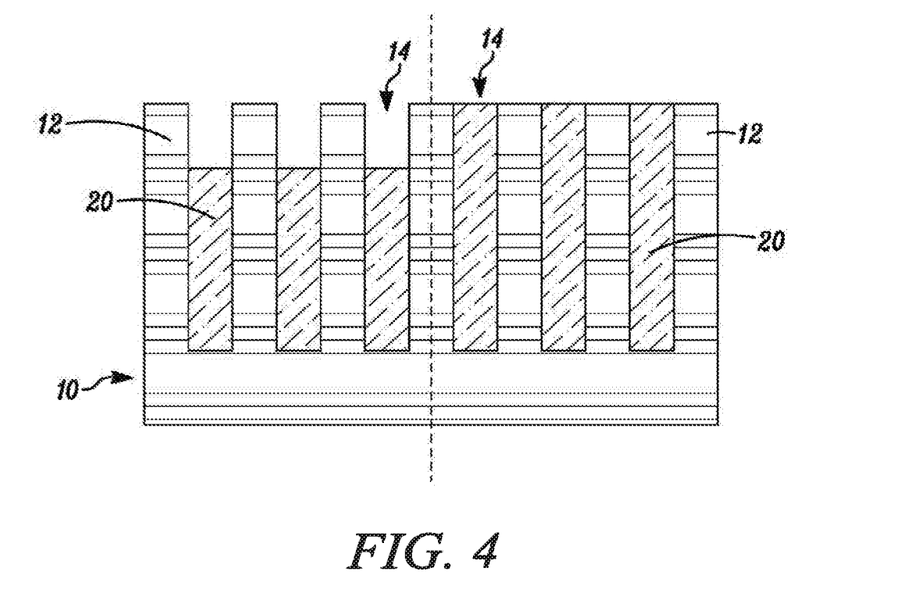
FIG. 4 shows fill materials in substantially solid form in the spaces between the high aspect ratio features after removal of the solvent from the displacement solution, with the fill materials either partially filling the spaces (at left) or completely filling the spaces (at right)

Referring to FIG. 4, the substrate is shown after the first heat treatment step in which only substantially solid fill materials 20 remaining within the spaces 14 between the high aspect ratio features 12, with the fill materials either partially or substantially filling the spaces, as shown to the left in FIG. 4, or completely filling the spaces, as shown to the right in FIG. 4. Advantageously, the substantially solid fill materials physically support the high aspect ratio features and prevents their collapse during this and subsequent stages of the present process.

In a final step, the primary and secondary fill materials are removed via a plasma etching or ashing process, for example, oxygen plasma under argon. The plasma etching or ashing process may be carried out in an ambient air atmosphere or, alternatively, may be carried out in a vacuum or in an inert atmosphere under nitrogen or other inert gas, for example.

Figure 5:
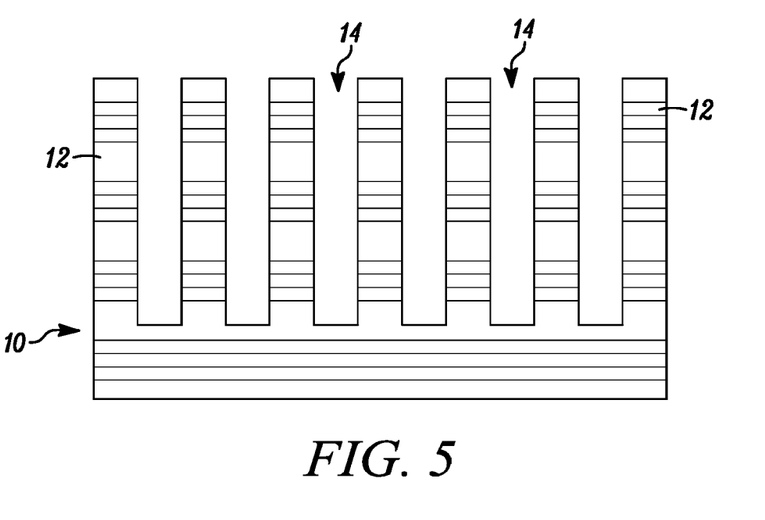
FIG. 5 shows the silicon substrate and high aspect ratio features after removal of the fill materials.

Referring to FIG. 5, after the fill materials are completely removed from spaces 14 between high aspect ratio features 12 of substrate 10, spaces 14 will be completely empty, with the geometry of the high aspect ratio features 12 preserved without collapse. Substrate 10 may then be subjected to further downstream processing steps as desired.

Advantageously, in one embodiment in which both first and second fill materials are used, it has been found that the presence of the second fill material facilitates higher etching (removal) rates than if the displacement solution included only the first fill material. In this manner, because the etching rate is higher, the substrate is exposed to the plasma for a shorter amount of time than in known processes, which mitigates or eliminates the removal of silicone from substrate 10 or its features 12, thereby preserving the resolution or geometry of the features 12.

For example, fill materials in accordance with the present disclosure which include both first and second fill materials may have etch rates (angstroms per second) as little as 80, 85, or 90, or as great as 100, 120, or 130, or any range between any two of the foregoing values, such as 180-130, 85-120, or 90 to 100, for example.

In a further embodiment of the present disclosure, displacement solutions may be formulated substantially as above, but may include only a second fill material, without a first fill material in the form of a phenol formaldehyde resin. These fill materials may have still higher etch rates (angstroms per second) as little as 180, 185, or 190, or as great as 195, 200, or 205, or within any range between any two of the foregoing values, such as 180-205, 185-200, or 190 to 195, for example.

In a still further embodiment of the present disclosure, displacement solutions may be formulated substantially as above, but may include only a first fill material, without a second fill material in the form of a polyalkene carbonate. These fill materials may have suitable etch rates (angstroms per second) as little as 50, 60, or 70, or as great as 80, 90, or 100, or within any range between any two of the foregoing values, such as 50-100, 60-90, or 70-80, for example.

As used herein, the phrase "within any range defined between any two of the foregoing values" literally means that any range may be selected from any two of the values listed prior to such phrase regardless of whether the values are in the lower part of the listing or in the higher part of the listing. For example, a pair of values may be selected from two lower values, two higher values, or a lower value and a higher value.

The following non-limiting Examples serve to illustrate the disclosure.

EXAMPLES

Example 1

Displacement Solutions Containing Only First Fill Materials

Displacement solution formulations containing only a first fill material were prepared from the stock solutions containing about 40% by weight of a novolac resin by adding the materials listed in Table 1 below. Resulting formulations contained % solids as shown in Table 1. The solutions were then spin coated on 4" silicon wafers at 1500 rpm and baked for 60 seconds each on contact hot plates at 160° C. and 180° C. Film thickness and refractive index data are as shown in Table 1 below.

TABLE 1

| | Materials & Formulations | | | |
|---|---|---|---|---|
| | Form. 1 (gm) | Form. 2 (gm) | Form. 3 (gm) | Form. 4 (gm) |
| Novolac resin | 10 | 10 | 4879.5 | 8000 |
| Surfactant | 5.15 | 3.1 | 805.9 | 968.8 |
| Polyglycol methyl ether acetate (PGMEA) | 41.5 | 21 | 3178.6 | 1688 |
| total | 56.65 | 34.1 | 8864 | 10656.8 |
| % solids | 7.59 | 12.61 | 23.67 | 32.28 |
| Spin RPM | 1500 | 1500 | 1500 | 1500 |
| FT(A) | 2003 | 4006 | 10000 | 20000 |
| RI at 633 nm | 1.63 | 1.63 | 1.63 | 1.63 |
| Contact Hot Plate baking | 160 C./180 C./60 sec each | | | |

Figure 6:
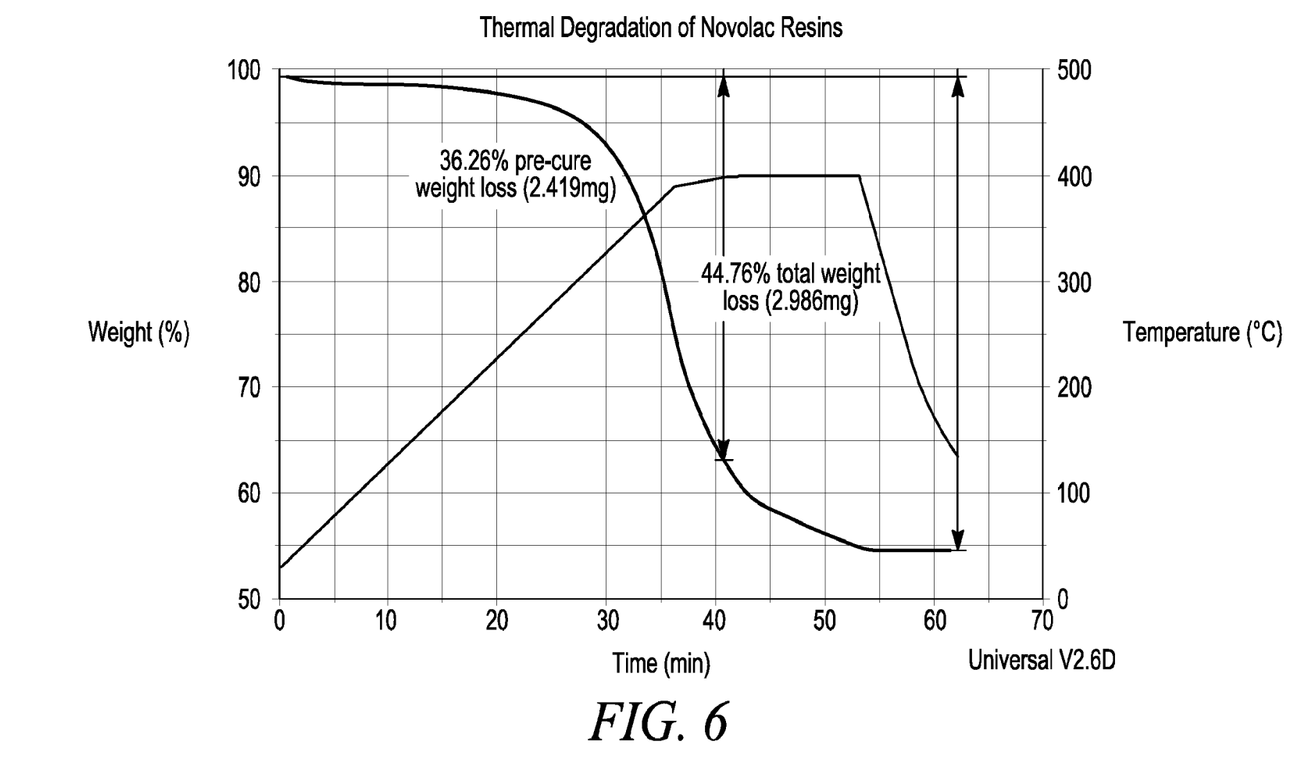
FIG. 6 corresponds to Example 1, and shows etch rate data.

Thermal degradation of the above polymers was evaluated by thermogravimetric analysis (TGA) as shown in FIG. 6, which clearly shows that these polymers do not cleanly burn off at elevated temperatures. In this manner, it was confirmed that fill materials of novolac resins alone may not be suitable for applications where solid polymer fill needs to be thermally removed at about 300° C.

Example 2

Displacement Solution Formulations

Formulation blends of a first fill material in the form of novolac resins and a second fill material in the form of a polypropylene carbonate of this disclosure were prepared by combining several commercially available novolac resins (novolacs 1-5) with stock solutions of polypropylene carbonate resin as listed in Table 2 below. Resulting formulations contained % solids as shown to the left in Table 2 below. The solutions were then spin coated on 4" silicon wafers and baked for 60 seconds each on contact hot plates at 160° C. and 180° C. Film thickness and refractive index data are as shown in Table 2 below.

TABLE 2

| | Materials and Formulations | | | | |
|---|---|---|---|---|---|
| | Novolac 1 (gm) | Novolac 2 (gm) | Novolac 3 (gm) | Novolac 4 (gm) | Novolac 5 (gm) |
| Primary/secondary fill material ratio (wt. %) | 100/0 | 90/10 | 70/30 | 50/50 | 0/100 |
| Commercial novolac resin | 107.1 | 77.14 | 60 | 36 | 0 |
| 10% Polypropylene carbonate in PGMEA | 0 | 30 | 90 | 126 | 225 |
| Polyglycol methyl ether acetate (PGMEA) | 142.9 | 92.86 | 80 | 90 | 25 |
| total | 250 | 200 | 230 | 252 | 250 |

TABLE 2-continued

| | Materials and Formulations | | | | |
|---|---|---|---|---|---|
| | Novolac 1 (gm) | Novolac 2 (gm) | Novolac 3 (gm) | Novolac 4 (gm) | Novolac 5 (gm) |
| % solids | 13.8% | 14% | 12.3% | 9.6% | 9% |
| Spin RPM | 1000 | 1000 | 1000 | 1000 | 1000 |
| FT (A) | 4832 | 4870 | 5246 | 4112 | 4813 |
| RI at 633 nm | 1.63 | 1.61 | 1.46 | 1.54 | 1.46 |
| Contact Hot Plate | | 160 C./180 C./60 sec each | | | |

Example 3

Etch Rate Study

Formulation blends of a first fill material in the form of a novolac resin and/or a second fill material in the form of a polypropylene carbonate of this disclosure were prepared as described in Example 2, and were coated on 8" silicon wafers and baked at 180° C./280° C. for 60 seconds in air on hot plates. Pre-etch data is set forth below in Table 3.

The resulting films were then subjected to oxygen plasma in the MXP etch chamber (P-5000 etcher) under the conditions of 40 sccm of Oxygen, 300 sccm of Argon at 300 mT pressure and 200 W of power. Plasma etch rates were calculated from the difference in film thickness before and after etching. Improvement to etch rate for films of polymer blends was calculated against the etch rate of novolac films not including PCCs. For comparison, etch rates of pure polypropylene carbonate films (T27M100) were also determined. All data including process details are shown in Tables 4A and 4B below.

TABLE 3

| Blend Ratio (Polypropylene carbonate/Novolac) (wt. %) | Novolac Material | Spin RPM | Pre-etch FT (A) | Pre-etch RI @ 633 nm |
|---|---|---|---|---|
| 0/100 | Comp. Form. 2 (Example 1) | 1000 | 4278 | 1.65 |
| | | | 4372 | 1.64 |
| | | | 4375 | 1.64 |
| | | | 4360 | 1.64 |
| | | | 4361 | 1.64 |
| | | | 4362 | 1.64 |
| 10/90 | Novolac 2 (Example 2) | 1000 | 4348 | 1.62 |
| | | | 4228 | 1.63 |
| | | | 4338 | 1.62 |
| | | | 4364 | 1.62 |
| | | | 4347 | 1.62 |
| | | | 4298 | 1.62 |
| 30/70 | Novolac 3 (Example 2) | 1500 | 3852 | 1.58 |
| | | | 3860 | 1.58 |
| | | | 3868 | 1.58 |
| | | | 3880 | 1.57 |
| | | | 3870 | 1.58 |
| | | | 3871 | 1.58 |
| 50/50 | Novolac 4 (Example 2) | 1000 | 3585 | 1.55 |
| | | | 3655 | 1.54 |
| | | | 3761 | 1.53 |
| | | | 3642 | 1.54 |
| 100/0 | Polypropylene carbonate | 1000 | 3847 | 1.45 |
| | | | 3822 | 1.45 |
| | | | 3767 | 1.45 |
| | | | 3731 | 1.45 |
| | | | 3775 | 1.45 |
| | | | 3749 | 1.45 |

TABLE 4A

| Blend Ratio (Polypropylene carbonate/Novolac) | Novolac Material | Etch Time (sec) | Pre-etch FT (A) | Post-etch FT (A) | Etch Rate (ER) (A/sec) |
|---|---|---|---|---|---|
| 0/100 | Comp. Form. 2 (Example 1) | 10 | 4278 | 3704 | 57 |
| | | | 4372 | 3755 | 62 |
| | | 15 | 4375 | 3456 | 61 |
| | | | 4360 | 3425 | 62 |
| | | 30 | 4361 | 2159 | 73 |
| | | | 4362 | 2159 | 73 |
| 10/90 | Novolac 2 (Example 2) | 10 | 4348 | 3720 | 63 |
| | | | 4228 | 3631 | 60 |
| | | 15 | 4338 | 3348 | 66 |
| | | | 4364 | 3360 | 67 |
| | | 30 | 4347 | 2077 | 76 |
| | | | 4298 | 2052 | 75 |
| 30/70 | Novolac 3 (Example 2) | 10 | 3852 | 2941 | 91 |
| | | | 3860 | 2938 | 92 |
| | | 15 | 3868 | 2566 | 87 |
| | | | 3880 | 2565 | 88 |
| | | 30 | 3870 | 1357 | 84 |
| | | | 3871 | 1365 | 84 |
| 50/50 | Novolac 4 (Example 2) | 15 | 3585 | 1989 | 106 |
| | | | 3655 | 1995 | 111 |
| | | 30 | 3761 | 668 | 103 |
| | | | 3642 | 684 | 99 |
| 100/0 | Polypropylene carbonate | 10 | 3847 | 1898 | 195 |
| | | | 3822 | 1911 | 191 |
| | | 15 | 3767 | 871 | 193 |
| | | | 3731 | 854 | 192 |
| | | 30 | 3775 | bare Si | |
| | | | 3749 | bare Si | |

TABLE 4B

| Blend Ratio (Polypropylene carbonate/Novolac) | Etch Time (sec) | Avg. ER (A/sec) | ER Ratio (Blends/Accuflo) | Improvement in ER | Avg. Improvement in ER |
|---|---|---|---|---|---|
| 0/100 | 10 | 60 | 1.00 | 0% | 0% |
| | 15 | 62 | 1.00 | 0% | |
| | 30 | 73 | 1.00 | 0% | |
| 10/90 | 10 | 61 | 1.03 | 3% | 4% |
| | 15 | 66 | 1.08 | 8% | |
| | 30 | 75 | 1.03 | 3% | |

TABLE 4B-continued

| Blend Ratio (Polypropylene carbonate/Novolac) | Etch Time (sec) | Avg. ER (A/sec) | ER Ratio (Blends/Accuflo) | Improvement in ER | Avg. Improvement in ER |
|---|---|---|---|---|---|
| 30/70 | 10 | 92 | 1.54 | 54% | 36% |
|  | 15 | 87 | 1.41 | 41% |  |
|  | 30 | 84 | 1.14 | 14% |  |
| 50/50 | 15 | 109 | 1.76 | 76% | 56% |
|  | 30 | 101 | 1.37 | 37% |  |
| 100/0 | 10 | 193 | 3.24 | 224% | 218% |
|  | 15 | 192 | 3.11 | 211% |  |
|  | 30 | — | — | — |  |

Films containing both first and second fill materials containing equal to or greater than 30 wt % of polypropylene carbonate yielded 40-80% improvement under the test conditions, and the films of propylene carbonate etched 200% faster than the film including only novolac resin as a first fill material. In this manner, it is confirmed that plasma etch rate of novolac films can be enhanced by using polymer blends with polyalkene carbonates, and yet displacemnt solution including only first fill materials or only second fill materials are still effective.

As used herein, the singular forms "a", "an" and "the" include plural unless the context clearly dictates otherwise. Moreover, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the disclosure be limited to the specific values recited when defining a range.

It should be understood that the foregoing description is only illustrative of the present disclosure. Various alternatives and modifications can be devised by those skilled in the art without departing from the disclosure. Accordingly, the present disclosure is intended to embrace all such alternatives, modifications and variances that fall within the scope of the appended claims.

What is claimed is:

1. A method for preventing collapse of semiconductor substrate features, comprising the steps of:
    providing a patterned semiconductor substrate having a plurality of high aspect ratio features with spaces between the features, the gap spaces at least partially filled with an initial fluid;
    displacing the initial fluid with a displacement solution including at least one solvent and at least one fill material in the form of at least one phenol-formaldehyde polymer, the displacement solution including from 5 wt. % to 30 wt. % of the fill material, based on the total weight of the displacement solution, and wherein the at least one phenol-formaldehyde polymer of the following formula:

wherein each is independently a hydrogen or a hydrocarbon group containing up to 20 carbons, n ranges between 2 and 200, any of the R groups may be bonded to any of the aromatic carbon atoms, i.e. $C_2$ to $C_6$, the $CH_2$ (methylene) groups may be bonded either to any of the aromatic carbon atoms, to $C_2$ to $C_6$, or to any aromatic ring and the average ratio of methylene groups to aromatic rings in the polymer may vary from between about 0.5 to about 1.5, and wherein the displacement solution has a viscosity from 1.0 cP to 20.0 cP;
    exposing the substrate to a first elevated temperature to substantially remove the solvent from the spaces and deposit the fill material in substantially solid form within the spaces; and
    exposing the substrate to a dry etch process to remove the fill material from the gap spaces.

2. The method of claim 1, wherein the first temperature is between 100° C. and 175° C.

3. The method of claim 1, wherein the at least one solvent includes a solvent having a boiling point between 50° C. and 250° C.

4. The method of claim 1, wherein said displacement step is carried out via spin coating.

5. The method of claim 1, wherein the initial fluid is an aqueous wash solution.

6. The method of claim 1, wherein the initial fluid comprises a non-aqueous flushing solution.

7. A method for preventing collapse of semiconductor substrate features, comprising the steps of:
    providing a patterned semiconductor substrate having a plurality of high aspect ratio features with spaces between the features, the gap spaces at least partially filled with an initial fluid;
    displacing the initial fluid with a displacement solution including at least one solvent, at least one first fill material in the form of a phenol-formaldehyde polymer, and at least one second fill material in the form of a polyalkene carbonate (PAC), the displacement solution including from 5 wt. % to 30 wt. % of the fill materials, based on the total weight of the displacement solution, and wherein the at least one phenol-formaldehyde polymer of the following formula:

wherein each R is independently a hydrogen or a hydrocarbon group containing up to 20 carbons, n ranges between 2 and 200, any of the R groups may be bonded to any of the aromatic carbon atoms, i.e. $C_2$ to $C_6$, the $CH_2$ (methylene) groups may be bonded either to any of the aromatic carbon atoms, to $C_2$ to $C_6$, or to any aromatic ring and the average ratio of methylene groups to aromatic rings in the polymer may vary from between about 0.5 to about 1.5, and wherein the displacement solution has a viscosity from 1.0 cP to 20.0 cP;
    exposing the substrate to a first elevated temperature to substantially remove the solvent from the spaces and deposit the first and second fill materials in substantially solid form within the spaces; and
    exposing the substrate to a dry etch process to remove the first and second fill materials from the gap spaces.

8. The method of claim 7, wherein the at least one second fill material comprises at least one polyalkene carbonate (PAC) selected from the group consisting of polypropylene carbonate, polybutylene carbonate, poly(cyclohexane) carbonate, poly(norbornene) carbonate, and combinations thereof.

9. The method of claim 7, wherein the first temperature is between 100° C. and 175° C.

10. The method of claim 7, wherein the at least one solvent includes a solvent having a boiling point between 50° C. and 250° C.

11. The method of claim 7, wherein said displacement step is carried out via spin coating.

12. The method of claim 7, wherein the first and second fill materials are substantially insoluble in water.

13. The method of claim 7, wherein the displacement solution further includes between 5 wt. % and 50 wt. % of the at least one first fill material and between 50 wt. % and 95 wt. % of the at least one second fill material, based on the combined weight of the first and second fill materials.

14. The method of claim 7, wherein said exposing steps are conducted in one of an ambient air atmosphere and an atmosphere of an inert gas.

15. A method for preventing collapse of semiconductor substrate features, comprising the steps of:
    providing a patterned semiconductor substrate having a plurality of high aspect ratio features with spaces between the features, the gap spaces at least partially filled with an initial fluid;
    displacing the initial fluid with a displacement solution including at least one solvent and at least one fill material in the form of a polyalkene carbonate (PAC), the displacement solution including from 5 wt. % to 30 wt. % of the fill material, based on the total weight of the displacement solution, and wherein the displacement solution has a viscosity from 1.0 cP to 20.0 cP;
    exposing the substrate to a first elevated temperature to substantially remove the solvent from the spaces and deposit the fill material in substantially solid form within the spaces; and
    exposing the substrate to a dry etch process to remove the fill material from the gap spaces.

16. The method of claim 15, wherein the fill material comprises at least one polyalkene carbonate (PAC) selected from the group consisting of polypropylene carbonate, polybutylene carbonate, poly(cyclohexane) carbonate, poly(norbornene) carbonate, and combinations thereof.

17. The method of claim 15, wherein the first temperature is between 100° C. and 175° C.

\* \* \* \* \*